United States Patent [19]

Bazin

[11] 3,983,452
[45] Sept. 28, 1976

[54] HIGH EFFICIENCY DEFLECTION CIRCUIT

[75] Inventor: Lucas John Bazin, Stratford, N.J.

[73] Assignee: RCA Corporation, New York, N.Y.

[22] Filed: Mar. 31, 1975

[21] Appl. No.: 563,878

[52] U.S. Cl. .............................. 315/397; 315/387; 315/403
[51] Int. Cl.² ...................... H01J 29/70; H01J 29/76
[58] Field of Search ........... 315/387, 389, 396, 397, 315/403

[56] References Cited
UNITED STATES PATENTS

| | | | |
|---|---|---|---|
| 3,784,857 | 1/1974 | Christopher | 315/389 |
| 3,887,842 | 6/1975 | Owens, Jr. et al. | 315/397 |

Primary Examiner—Maynard R. Wilbur
Assistant Examiner—T. M. Blum
Attorney, Agent, or Firm—Eugene M. Whitacre; Paul J. Rasmussen

[57] ABSTRACT

A push-pull common emitter deflection output stage energized by a relatively low direct voltage includes zener diode drive coupling to its input circuit for reducing crossover distortion. A diode in series with a deflection winding disconnects the output stage from the winding during a portion of the retrace interval to allow the retrace pulse voltage to rise to a relatively high direct voltage supplied through a switched transistor only during the retrace interval to reduce power dissipation in the output stage. Current feedback from the deflection winding to a driver stage during trace and retrace intervals accurately determines the retrace duration.

5 Claims, 7 Drawing Figures

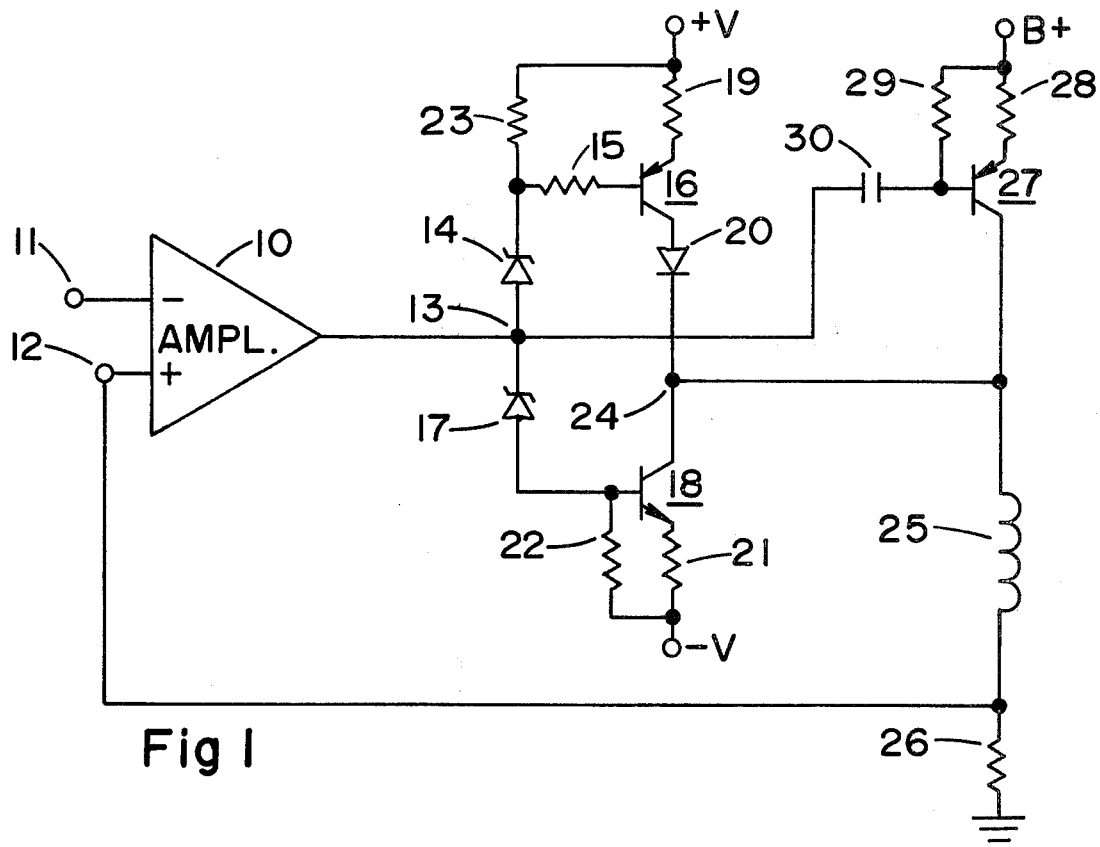
Fig 1
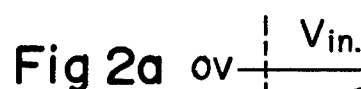
Fig 2a  $V_{in.}$
Fig 2b  $I_{yoke}$
Fig 2c  $I_{Q16}$
Fig 2d  $I_{Q18}$
Fig 2e  $I_{Q27}$
Fig 2f  $V_{yoke}$
$T_0$  $T_1$  $T_2$  $T_3$ $T_4$

HIGH EFFICIENCY DEFLECTION CIRCUIT

BACKGROUND OF THE INVENTION

This invention relates to a high efficiency deflection circuit with controlled retrace pulse parameters.

Deflection amplifiers are often utilized to drive a generally sawtooth scanning current through a vertical or horizontal deflection winding mounted around the outside of an image pickup cathode ray tube or an image display tube, such as a television camera pickup tube or a television picture tube. Transistor deflection amplifiers of the general class-B push-pull type are frequently utilized instead of class-A amplifiers because of the inherent greater efficiency of the former type in that the amplifier can be operated with relatively little quiescent current, just enough to prevent crossover distortion, as first one output transistor and then the other conducts during the respective positive and negative portions of each deflection current cycle.

Ideally the direct operating voltage energizing the push-pull transistors should be not much higher than required for the signal voltage excursions of the stages. In this manner the undesirable power dissipation in the transistor output stages is minimized and transistors with lower power and peak voltage ratings can be utilized. The resultant cost saving to the equipment manufacturer and equipment buyer is highly desirable. However, during each deflection cycle there is a retrace portion during which the scanning current in the deflection winding must be reversed in a relatively short time in order to quickly return the electron beam to its start-of-scan position along one edge of the scanned raster to begin the next scanning interval. With the inductance of the winding and the peak current remaining the same during the scanning, or trace, and retrace portions of each deflection cycle, a relatively high voltage is developed across the winding to effect the necessary current reversal.

In the past, provision for this relatively high voltage retrace pulse has been made in three general ways. First, the operating voltage across the output transistors can be increased so they may conduct to the peak pulse level. The main disadvantage with this arrangement is that circuit power dissipation during the scanning period will be greatly increased and higher rated transistors must be utilized. Second, the winding can be disconnected from the output transistors during retrace and a resonant circuit including the deflection winding be allowed to resonate during the retrace period. The main disadvantages with this arrangement are that some damping means such as a diode is often required to allow only the required polarity of retrace pulse voltage and the damped energy is lost unless there is provided some energy storage means such as a capacitor to store this energy. Further, the retrace circuit resonant frequency may not provide the desired retrace interval width. Third, a disconnect circuit and a stage to switch in a higher operating voltage during the retrace interval may be utilized. However, even with this arrangement alone there is no assurance that the desired retrace interval duration will be achieved. In many situations, such as when three separate deflection circuits operate simultaneously to cause simultaneous deflection within three image pickup tubes in a color television camera, it is necessary that the retrace interval duration of each deflection circuit be accurately controlled to ensure the necessary registration of the three rasters.

SUMMARY OF THE INVENTION

A deflection circuit includes a driver stage coupled to two serially coupled transistors coupled between the terminals of a relatively low direct voltage source in a push-pull amplifier configuration. A deflection winding is coupled to an output terminal of the amplifier and a feedback resistor which supplies current feedback to the driver stage. A third transistor is coupled to the output terminal and a relatively high direct voltage source and to the driver stage and is responsive to the drive signals to conduct only during the retrace interval of each deflection cycle to supply the high voltage to the winding. A switch is coupled between one of the output transistors and the deflection winding to disconnect that transistor when the retrace pulse rises above the relatively low direct voltage. The feedback path controls the start of the next trace interval to accurately determine the retrace interval duration.

A more detailed description of the invention is given in the following description and accompanying drawing of which:

FIG. 1 is a circuit diagram of a deflection circuit embodying the invention; and FIGS. 2a–2f are normalized waveforms illustrating voltages and currents obtained in the circuit of FIG. 1.

DESCRIPTION OF A PREFERRED EMBODIMENT OF THE INVENTION

Referring to FIGS. 1 and 2a–2f, a source of input signals (not shown) producing a sawtooth input voltage is coupled to a terminal 11 of a driver stage amplifier 10. An inverted amplified version, the waveform of FIGS. 2a, of this input waveform is obtained from an output terminal 13 of amplifier 10. Terminal 13 is coupled through a zener diode 14 and resistor 15 to the base of a first output transistor 16 and through a zener diode 17 to the base of a second output transistor 18. Transistors 16 and 18 are serially coupled in circuit with a terminal +V, a resistor 19, a disconnect diode 20, an output terminal 24, a resistor 21 and a terminal −V. Terminals +V and −V provide a first source of relatively low direct operating voltage. Terminal +V may be at a +12.5 volt potential and terminal −V at a −12.5 volt potential. A biasing resistor 23 is coupled from the +V terminal to the base of transistor 16 and a biasing resistor 22 is coupled from the −V terminal to the base of transistor 18. Transistors 16 and 18 and their associated circuit elements form a complementary symmetry push-pull common emitter output amplifier stage.

The quiescent voltage at terminal 13 is zero volts. Zener diodes 14 and 17 provide the necessary offset to the signals obtained at terminal 13 to provide base drive for transistors 16 and 18, respectively. It is noted that the breakdown voltage of each of zener diodes 14 and 17 may be selected to be slightly less than the + and −12.5 volt supply terminals +V and −V to enable the use of less expensive looser tolerance circuit components. Such a selection would result in a crossover region in the middle portion ($T_1$) of the deflection signals in which both transistors 16 an 18 would be conducting. A further advantage of this selection is that crossover distortion is eliminated, resulting in a linear deflection yoke current, FIG. 2b, through the central trace region around $T_1$.

Amplifier output terminal 24 is coupled through a series connected deflection winding 25 and feedback resistor 26 to a point of reference potential, illustrated in this embodiment as being at ground potential. The junction of deflection current sampling resistor 26 and deflection winding 25 is coupled to an input terminal 12 of driver stage amplifier 10 to form a feedback path thereto to ensure the desired degree of linear current through deflection winding 25. It is noted that the signal obtained at output terminal 13 is repesentative of the difference between the input signal of FIG. 2a present at input terminal 11 and the current representative voltage signal fed back to input terminal 12 of driver amplifier 10.

A third transistor 27 is coupled from a relatively high voltage source terminal B+ through a resistor 28 to the junction of output terminal 24 and deflection winding 25. Transistor 27 has its main conduction path poled the same as transistor 16, and, as will be explained subsequently, provides a path for retrace current through deflection winding 25 when transistor 16 is disconnected. The relatively high potential at terminal B+ may be in the order of 85 volts, and is chosen to be slightly higher than the retrace pulse voltage developed across deflection winding 25 during the retrace interval, $T_2 - T_4$. A resistor 29 coupled between terminal B+ and the base of transistor 27 provides bias thereto. A capacitor 30 couples the drive signal obtained at terminal 13 to the base of transistor 27 to control its conduction during the retrace interval.

In operation, during the first half of the trace interval, $T_0 - T_1$, the negative portion of the waveform of FIG. 2a present at terminal 13 is coupled through zener diode 14 and resistor 15 and causes transistor 16 to conduct. The collector current of transistor 16 is illustrated in FIG. 2c. This current flows from +V through resistor 19, transistor 16, forward biased diode 20, winding 25 and resistor 26 to ground and provides the first half of the yoke trace scanning current as illustrated in FIG. 2b, $T_0 - T_1$.

At $T_1$ the waveform of FIG. 2a becomes positive, resulting in the cutting off of transistor 16 and the conduction of transistor 18, the collector current of which is illustrated in FIG. 2d during the second half of the trace interval, $T_1 - T_2$. The deflection winding current reverses at $T_1$ and flows from ground up through resistor 26, winding 25, transistor 18 and resistor 21 to the −V terminal.

At $T_2$ the voltage drive waveform of FIG. 2a starts to decrease, but still being positive, transistor 18 still conducts. The relatively quick decrease in the waveform of FIG. 2a during the first half, $T_2 - T_3$, of the retrace interval causes a relatively quick collapse of the magnetic flux in deflection winding 25 and results in a rapidly rising positive going retrace pulse developed at terminal 24 with respect to ground as illustrated by the retrace pulse voltage waveform in FIG. 2f. The retrace current in the winding 25 decays to zero at $T_3$, at which time the voltage drive waveform of FIG. 2a at terminal 13 passes through zero and goes negative. This cuts off transistor 18. Transistor 16 cannot conduct because diode 20 is reverse biased by the relatively high positive retrace pulse. However, the negative excursion of the drive waveform of FIG. 2a during the second half, $T_3 - T_4$, of the retrace interval is coupled through capacitor 30 and causes transistor 27 to conduct. It is again noted that the level of positive operating voltage at terminal B+ is selected higher than the peak positive retrace pulse level. Thus, deflection winding current during the interval $T_3 - T_4$ is conducted from B+ through resistor 28, transistor 27, winding 25 and resistor 26 to ground. As the retrace current near $T_4$ reaches its maximum and decreases in slope, the retrace voltage pulse of FIG. 2f rapidly decreases. When it drops below the +V level, diode 20 becomes forward biased and transistor 16 can conduct.

During the retrace interval the deflection winding current is continuously monitored by feedback resistor 26. When the peak retrace current reaches a maximum at $T_4$, a retrace current representative voltage is fed back to terminal 12 of driver stage amplifier 10 to be compared with the input sawtooth voltage at terminal 11 and the resulting now more slowly linearly increasing waveform at terminal 13 (FIG. 2a) initiates the next trace interval.

During the second half of the retrace interval, $T_3 - T_4$, when the drive waveform of FIG. 2a is negative, the base-emitter junction of transistor 16 is forward biased even though its main conduction path is blocked by the reverse biased disconnect diode 20. To this end, resistor 15 is inserted in series with the base of transistor 16 to reduce excessive base-emitter junction dissipation as well as to reduce the loading on drive amplifier 10, which is charging capacitor 30 during this interval.

It is noted that transistor 27 is conducting with a high voltage across it only during a relatively short interval $T_3 - T_4$. Similarly, diode 20, serving to disconnect transistor 16 during the interval $T_3 - T_4$, prevents dissipation in that power stage. Further, with the feedback signal fed back to driver amplifier 10 during retrace, as well as during the trace interval, the retrace interval duration is controlled by the input signal at terminal 11 and is not dependent only on the L to R ratio of winding 25. In this manner, it is relatively easy to match the retrace intervals of several deflection circuits operating simultaneously by simply controlling the input sawtooth waveforms coupled to terminal 11.

What is claimed is:

1. A deflection circuit comprising:
   first and second serially coupled transistors forming a push-pull amplifier stage coupled to a first source of relatively low direct operating voltage, a junction of said first and second transistors forming an output terminal;
   a deflection winding and a feedback resistor serially coupled to said output terminal and a point of reference potential;
   a driver stage coupled to said amplifier stage and said feedback resistor and responsive to a source of input signals for defining trace and retrace intervals during each deflection cycle;
   first switching means coupled in a main current conduction path of said first transistor and said deflection winding; and
   second switching means coupled to said output terminal and a second source of relatively high direct operating voltage and responsive to signals obtained from said driver stage for coupling said deflection winding to said second source only during said retrace interval;
   said first switching means serving to disconnect the main current conducting path of said first transistor when retrace voltage developed across said deflection winding exceeds said first source voltage, and said feedback resistor sampling current in said deflection winding for determining the end of said retrace interval and the start of the next succeeding trace interval.

2. A deflection circuit according to claim 1 wherein said second switching means includes a third transistor having its main conduction path coupled between said second direct voltage source and said deflection winding and a control electrode coupled to an ouptput terminal of said driver stage and responsive to signals obtained therefrom.

3. A deflection circuit according to claim 2 wherein said third transistor is responsive to said driver signals for conducting retrace current of a first polarity during only a first portion of said retrace interval and said second transistor is responsive to said driver signals for conducting retrace current during only a second portion of said retrace interval.

4. A deflection circuit according to claim 3 wherein said first switching means comprises a diode poled for conducting scanning current through said first transistor and deflection winding during a first portion of said trace interval.

5. A deflection circuit according to claim 4 wherein said retrace current representative signal obtained from said feedback resistor is compared with said source of input signals in said driver stage for determining the end of said retrace interval and the start of said next succeeding trace interval.

\* \* \* \* \*